(12) United States Patent
Kadri et al.

(10) Patent No.: US 12,690,181 B2
(45) Date of Patent: Jul. 21, 2026

(54) WEARABLE COMPUTING DEVICE ACCESSORY FOR MITIGATING RADIO FREQUENCY RADIATION

(71) Applicant: ZEBRA TECHNOLOGIES CORPORATION, Lincolnshire, IL (US)

(72) Inventors: Irfan Kadri, Mississauga (CA); Sheng Du, East Setauket, NY (US)

(73) Assignee: Zebra Technologies Corporation, Lincolnshire, IL (US)

( * ) Notice: Subject to any disclaimer, the term of this patent is extended or adjusted under 35 U.S.C. 154(b) by 84 days.

(21) Appl. No.: 18/384,271

(22) Filed: Oct. 26, 2023

(65) Prior Publication Data

US 2025/0142794 A1 May 1, 2025

(51) Int. Cl.
| | |
|---|---|
| *H05K 9/00* | (2006.01) |
| *A45C 11/00* | (2006.01) |
| *A45C 15/00* | (2006.01) |
| *A45F 5/00* | (2006.01) |
| *H01Q 1/52* | (2006.01) |

(52) U.S. Cl.
CPC ............. *H05K 9/006* (2013.01); *A45C 11/00* (2013.01); *A45C 15/00* (2013.01); *A45F 5/00* (2013.01); *H01Q 1/526* (2013.01); *A45C 11/002* (2025.01); *A45C 11/003* (2025.01); *A45F 2005/002* (2013.01); *A45F 2005/008* (2013.01); *A45F 5/1516* (2025.01); *A45F 5/1525* (2025.01)

(58) Field of Classification Search
CPC .................. A45F 5/1525; A45F 5/1516; A45F 2005/002; A45F 2005/008; A45C 11/002; A45C 11/003; H04B 1/3838; H01Q 1/526; H05K 9/006
See application file for complete search history.

(56) References Cited

U.S. PATENT DOCUMENTS

| | | | | |
|---|---|---|---|---|
| 6,657,214 | B1 | 12/2003 | Foegelle et al. | |
| 8,662,362 | B1* | 3/2014 | Bastian .................. | H04B 1/385 |
| | | | | 248/205.2 |
| 9,622,557 | B1* | 4/2017 | Beavers .................... | A45F 5/00 |
| 9,761,930 | B2* | 9/2017 | Finegold ................ | H01Q 1/245 |
| 10,326,488 | B2* | 6/2019 | Wojcik ..................... | H04B 5/79 |
| 2004/0226836 | A1* | 11/2004 | Schreiber .................. | A45F 5/02 |
| | | | | 206/320 |
| 2008/0311965 | A1* | 12/2008 | Gao ...................... | H04B 1/3838 |
| | | | | 455/575.1 |

(Continued)

FOREIGN PATENT DOCUMENTS

WO 2023/018739 A1 2/2023

OTHER PUBLICATIONS

International Search Report and Written Opinion for International Patent Application No. PCT/US2024/051827 mailed on Jan. 15, 2025.

*Primary Examiner* — Jack W Lavinder

(57) ABSTRACT

An accessory for a computing device includes: a cradle defining a volume configured to receive the computing device, the cradle including: (i) an interior surface facing the volume and configured to engage with a housing of the computing device; and (ii) an exterior surface opposite the interior surface; and a conductive shield disposed between the volume and an object, the conductive shield configured to reduce radiation emitted by an antenna of the computing device towards the object.

17 Claims, 7 Drawing Sheets

(56) References Cited

U.S. PATENT DOCUMENTS

| | | | | |
|---|---|---|---|---|
| 2010/0113111 | A1* | 5/2010 | Wong | H05K 9/0056 455/575.5 |
| 2010/0327030 | A1* | 12/2010 | Yang | A45F 5/00 224/199 |
| 2012/0044115 | A1* | 2/2012 | McCaughey | H04B 1/3838 343/702 |
| 2014/0262474 | A1* | 9/2014 | Koeppel | A45F 5/02 174/376 |
| 2015/0150360 | A1* | 6/2015 | Soriano | A45F 5/00 224/222 |
| 2015/0288407 | A1* | 10/2015 | Hernandez | A45F 5/00 224/267 |
| 2016/0183667 | A1* | 6/2016 | MacColl | A45F 5/00 224/222 |
| 2016/0212893 | A1* | 7/2016 | Byler | G06F 1/1626 |
| 2017/0318712 | A1* | 11/2017 | Byler | G06F 1/1626 |
| 2019/0348751 | A1* | 11/2019 | Finegold | H01Q 1/002 |
| 2020/0221839 | A1* | 7/2020 | Hwang | H01Q 21/08 |
| 2021/0105916 | A1 | 4/2021 | Judy | |
| 2022/0232744 | A1 | 7/2022 | Dagoni et al. | |
| 2022/0345562 | A1* | 10/2022 | Anderson | H04M 1/185 |
| 2022/0418172 | A1 | 12/2022 | Perez Santafe et al. | |
| 2023/0329426 | A1* | 10/2023 | Dunbar | A45F 5/00 |
| 2024/0292585 | A1* | 8/2024 | Khachatryan | A45C 11/00 |
| 2025/0142794 | A1* | 5/2025 | Kadri | A45F 5/00 |

* cited by examiner

136

144

304

300

136'

304'

WEARABLE COMPUTING DEVICE ACCESSORY FOR MITIGATING RADIO FREQUENCY RADIATION

BACKGROUND

Mobile computing devices can include wireless communications assemblies, which generate varying levels of radio frequency (RF) radiation. Such devices can be used in a wearable modality, e.g., by coupling a computing device to an accessory such as an arm mount worn by an operator. The shape and size of the accessory may be constrained by proximity of the wireless communications assemblies to the operator.

BRIEF DESCRIPTION OF THE SEVERAL VIEWS OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
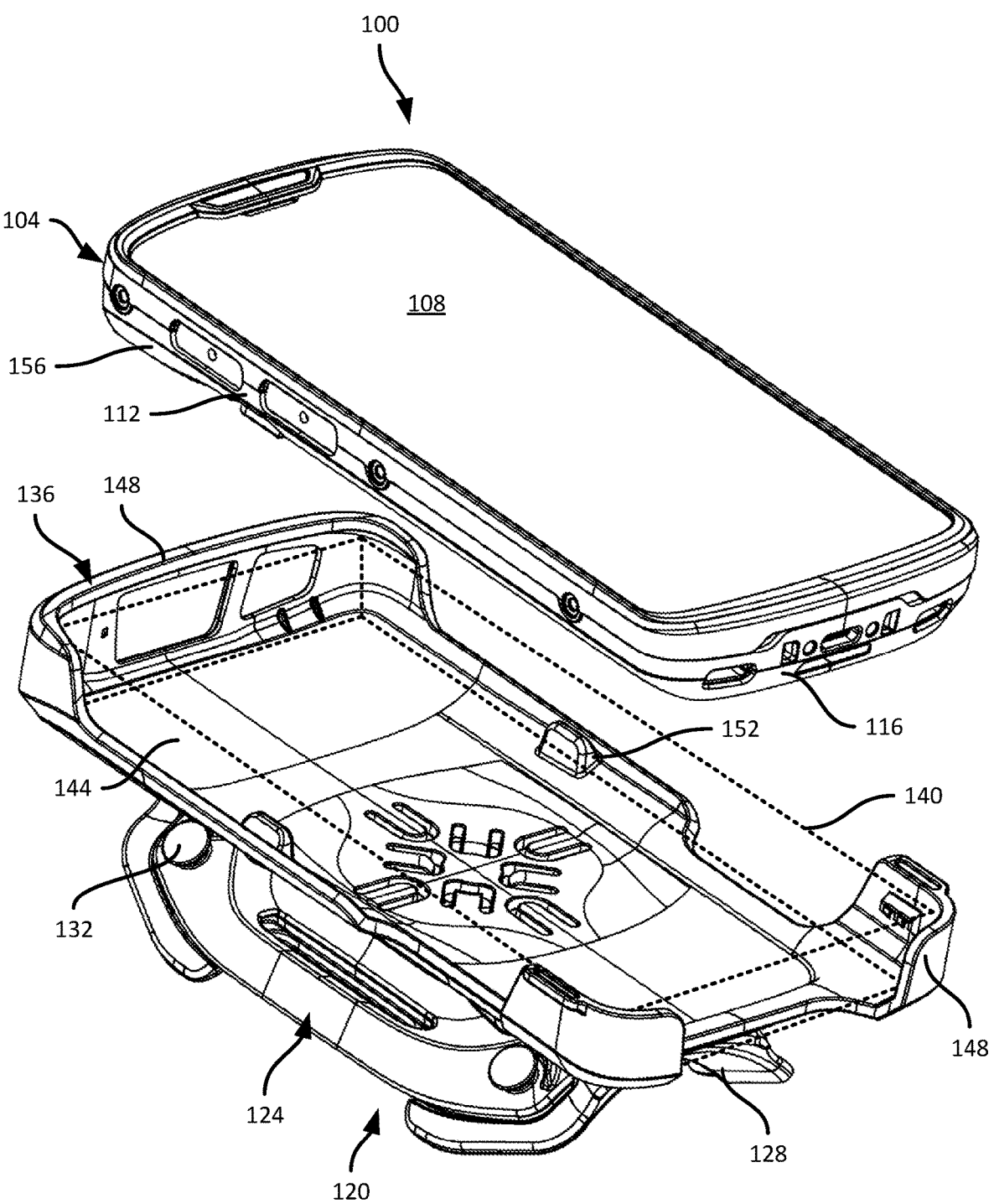
FIG. 1 is a diagram of a computing device and a mounting accessory for the computing device.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Examples disclosed herein are directed to an accessory for a computing device, the accessory comprising: a cradle defining a volume configured to receive the computing device, the cradle including: (i) an interior surface facing the volume and configured to engage with a housing of the computing device; and (ii) an exterior surface opposite the interior surface; and a conductive shield disposed between the volume and an object, the conductive shield configured to reduce radiation emitted by an antenna of the computing device towards the object.

Additional examples disclosed herein are directed to a wearable cradle for a computing device, the wearable cradle comprising: an exterior surface configured to couple the cradle to an object; an interior surface defining a volume configured to receive the computing device, a portion of the interior surface being configured to be disposed adjacent to an antenna of the computing device; and a shield disposed adjacent to the portion of the interior surface, the conductive shield configured to reduce radiation emitted by the antenna towards the object.

FIG. 1 illustrates a computing device 100 (also referred to herein as the device 100), such as a handheld computer or a smartphone. The device 100 can, in other examples, include any of a wide variety of other computing devices, such as a barcode scanner, a tablet computer, or the like. The computing device 100 includes a housing 104 supporting various other components of the computing device 100, including a display 108, e.g., integrated with a touch screen. The housing 104 can include, for example, a side wall 112 and an opposing side wall (not visible in FIG. 1), as well as a bottom wall 116 and an opposing top wall (not visible in FIG. 1), together forming a boundary around the display 108. The housing 104 can further include a rear wall opposite the display 108.

The device 100, in this example, can be operated in a handheld manner. Certain operating conditions may favor hands-free operation of the device 100, and the device 100 can therefore also be coupled (e.g., removably) with an accessory 120, such as an arm mount in the illustrated embodiment. The accessory 120 includes a mount 124 configured to engage with an object, such as a forearm of an operator. The mount 124 can include, for example, a curved surface 128 configured to engage with the operator's arm or other suitable surface. The mount 124 can also include one or more fasteners 132 such as posts, clips, or the like, configured to receive a textile band or other mounting structure configured to encircle the arm of the operator and thereby couple the mount 124 to the arm, retaining the surface 128 against the arm. Depending on the nature of the accessory 120, the device 100 can be mounted to a wide variety of objects in addition to a human operator, and can also be mounted to a human operator in a wide variety of ways (e.g., to a leg, a belt, a lanyard, or the like). The structure of the mount 124 can therefore also vary depending on the object to which the device 100 is to be mounted.

The accessory 120 also includes a cradle 136 supported on the mount 124, and configured to receive the computing device 100. The cradle 136 defines a volume 140 in which the device 100 is received when the device 100 is installed onto the cradle 136. The volume can be defined, for example, by an interior surface 144 and one or more side walls 148 extending outwards from the interior surface 144 (e.g., substantially perpendicularly from the interior surface 144). When the device 100 is placed into the volume 140, the rear wall opposite the display 108 can rest against the interior surface 144, and the walls 112 and 116 of the device 100 (as well as the opposing walls noted above) are bounded by the walls 148 of the cradle 136. The walls 148 and/or retaining features such as protrusions 152 can be configured to retain the device 100 against the interior surface 144. The interior surface 144 has a shape and size corresponding to the shape and size of the device 100, in this example. In other examples, the interior surface can include cutouts or the like, and need not extend over the entirety of the device 100. For example, the interior surface 144 can extend out to the walls 112, 116 (and opposite side and top walls) of the device 100 in some areas, but not others.

The device 100 includes at least one wireless communications assembly supported within the housing 104. The wireless communications assembly can include one or more antennas, as well as suitable control hardware and firmware for transmitting and receiving data via the antennas. The device 100 may, for example, include an antenna disposed within the housing 104 in a corner portion 156 of the housing 104. The device 100 can also include additional wireless communications assemblies with respective antennas.

Figure 2:
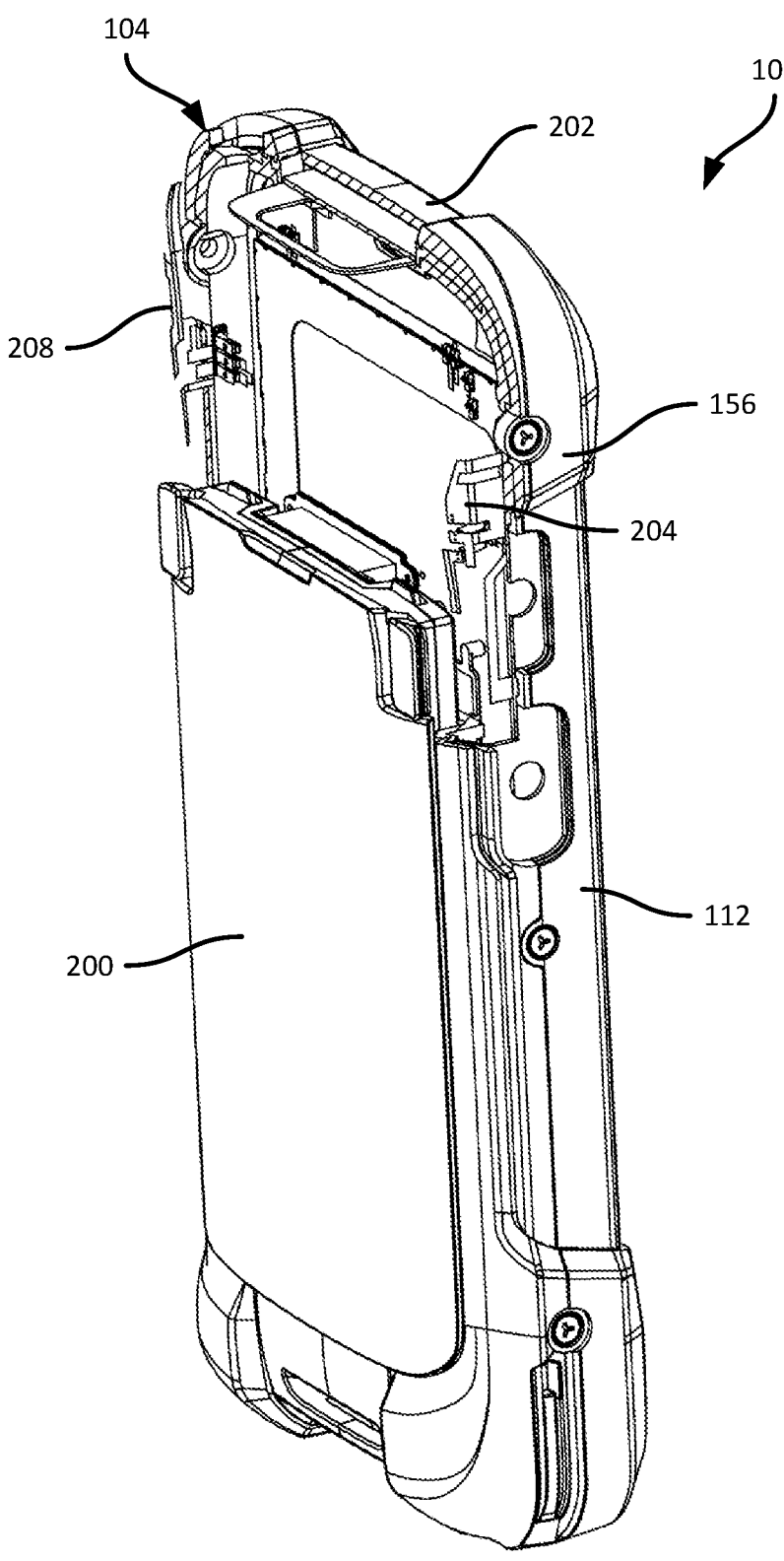
FIG. 2 is a diagram of the computing device with a partial cross-section illustrating antennas of the computing device.

Turning to FIG. 2, the device 100 is shown with a portion of the housing 104 removed, as indicated by hatched lines. In addition to the side wall 112, a rear wall 200 of the device 100 is shown in FIG. 2, e.g., including a removable battery cover. A top wall 202, opposite the bottom wall 116 shown in FIG. 1, is also visible in FIG. 2. The removed section of the housing 104 reveals a first antenna 204, within the corner portion 156 of the housing 104, and a second antenna 208 within another corner portion of the housing 104. The antennas 204 and 208 can be positioned on an inner surface of the housing 104, such as an inner surface of the rear wall 200. The antennas 204 and 208, in the illustrated example, are at or near a perimeter of the device 100, formed by the side wall 112, bottom wall 116, and the opposing side wall and top wall.

The antenna 204 can be, for example, a component of a wireless communications assembly configured to communicate according to one or more suitable Wi-Fi standards, and to implement a Global Positioning System (GPS) receiver, e.g., using the L1 specification. The antenna 208 can be a component of a second wireless communications assembly configured to communicate according to one or more suitable Wi-Fi standards (e.g., the same standards as the antenna 204, or a different set of standards), and to implement a GPS receiving using the L2 and L5 specifications. The device 100 can include a plurality of additional antennas, such as antennas used for wireless wide-area network (WWAN) communications according to standards such as 4G/Long Term Evolution (LTE), 5G, or the like. Such other antennas can be located within the housing 104, e.g., at other locations around the perimeter of the device 100.

The antennas 204 and 208 can be configured, when in use, to emit RF radiation in a substantially spherical pattern centered at the relevant antenna 204 or 208. It will be understood that depending on the communications standards implemented, beam steering may be employed to limit radiation emitted by a given antenna to certain sectors of the above spherical pattern. When the device 100 is worn by a human operator, operating the wireless communications interfaces of the device 100 may involve controlling the exposure of the operator to RF radiation from the antennas 204 and 208, e.g., to meet regulatory Specific Absorption Rate (SAR) limits.

As discussed below, the accessory 120 includes certain structural features to mitigate the exposure of an operator or other object to RF radiation from the antennas 204 and 208, thus enabling the accessory 120 to support the device 100 at a smaller distance away from the object, while continuing to meet SAR limits or other exposure-related metrics. Reducing a total height of the accessory 120 and device 100, e.g., by reducing a height between the surface 128 of the mount 124 and an exterior surface of the cradle, can reduce the likelihood of the device 100 or the accessory 120 striking other objects while in use. A lower-profile accessory 120 may also improve the comfort of the accessory 120, e.g., when worn by an operator.

Figure 3:
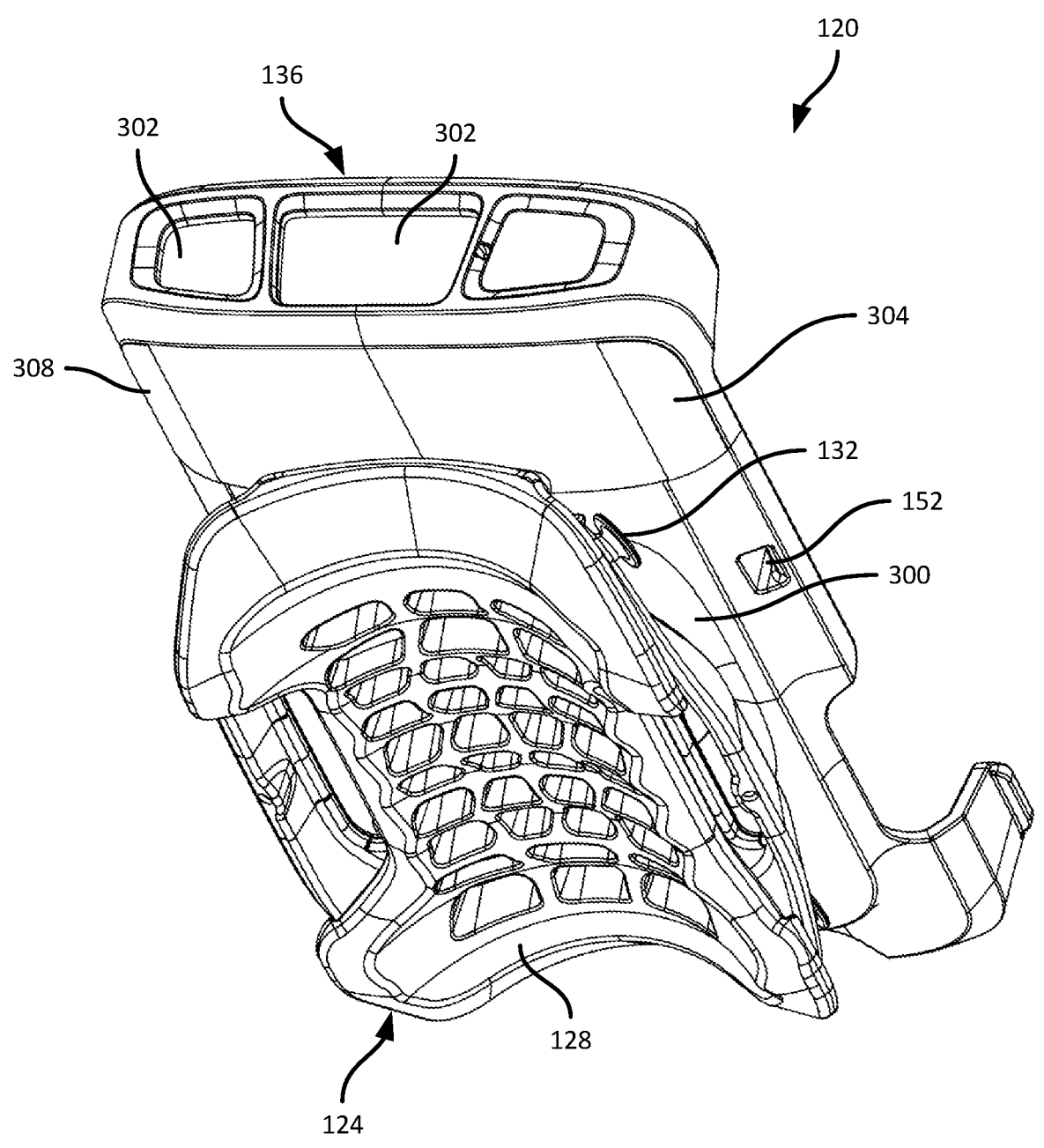
FIG. 3 is a diagram of the accessory of FIG. 1, viewed from below.

FIG. 3 illustrates the accessory 120 in isolation, from below. The cradle 136 includes an exterior surface 300, opposite the interior surface 144 shown in FIG. 1. The exterior surface 300 can be, for example, the other side of a body of material (e.g., injection-molded plastic, or the like) forming the cradle 136. The exterior surface 300 is connected to the mount 124, e.g., via a snap-on fastening, a rotatable joint enabling the cradle 136 to rotate in the plane of the exterior surface 300 relative to the mount 124, or the like. The cradle 136 can also include one or more openings 302, configured to align with the top wall 202 of the device 100 when the device 100 is in the cradle 136. The openings 302 can, for example, expose a scan window of an imaging assembly of the device 100 disposed on the top wall 202, and/or an illumination assembly such as a camera flash, or the like.

The accessory 120 also includes at least one conductive shield configured to mitigate radiation emitted by an antenna of the computing device 100 towards the operator or other object to which the mount 124 is configured to couple. In this example, the accessory 120 includes a first shield 304 corresponding to the antenna 204, and a second shield 308 corresponding to the antenna 208. The cradle 136 can be fabricated, e.g., by injection molding or other suitable manufacturing processes, from a non-conductive material such as one or more plastics. Making the cradle 136 from one or more non-conductive materials can reduce the degree to which the cradle 136 impacts the performance of the antennas 204 and 208 (e.g., range, sensitivity, and the like) when the device 100 is in the cradle 136. The shields 304 and 308 are conductive, e.g., in the form of sheets of metal, layers of conductive mesh (e.g., a metallic mesh), conductive fabric, or the like, and therefore reflect and/or absorb a portion of the radiation emitted by the antennas 204 and 208, respectively.

The shields 304 and 308 have surface areas and shapes selected to block a portion of radiation emitted by the antennas 204 and 208 towards the mount 124 (and therefore towards the operator or other object to which the mount 124 is coupled), while minimizing the impact of the shields 304 and 308 on the far field performance of the antennas 204 and 208. In some examples, a shield extending over substantially the entire exterior surface 300 can be provided, but such a shield may significantly reduce antenna performance (e.g., may result in a reduction in antenna efficiency greater than −4 dB). As will be apparent, when the device 100 includes more than the two antennas 204 and 208 noted above, the accessory 120 can include additional conductive shields beyond the shields 304 and 308. The sizes and shapes of the shields 304, 308, and any additional shields of the accessory 120 can be selected to reduce the total amount of radiation emitted by the antennas, e.g., when more than one (up to and including all) antenna is active.

Figure 4:
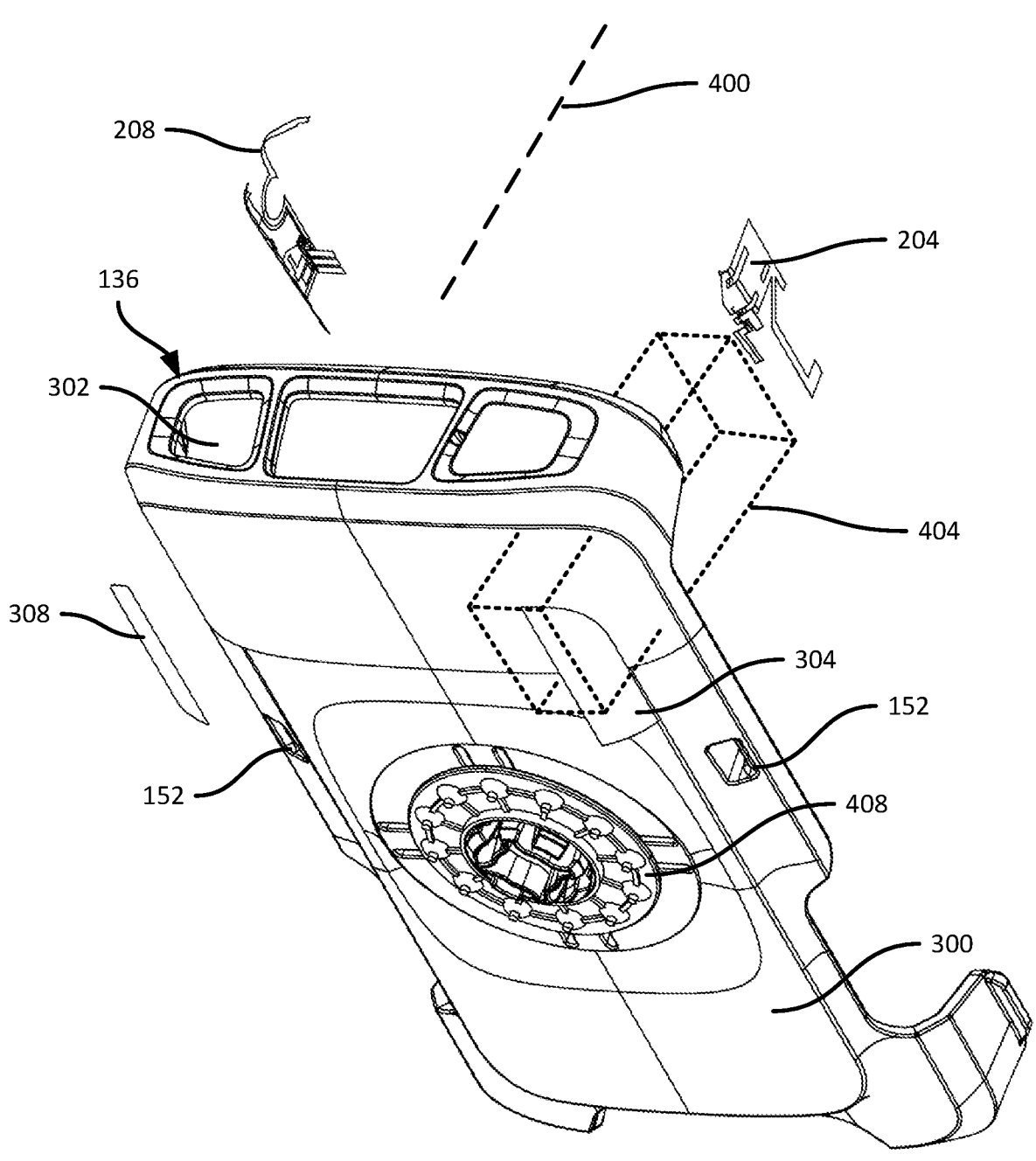
FIG. 4 is a diagram of a cradle of the accessory of FIG. 4.

Turning to FIG. 4, an exploded view of the cradle 136, antennas 204 and 208, and shields 304 and 308 is shown, to illustrate the position and size of the shields 304 and 308 on the cradle 136 relative to the antennas 204 and 208. To form the exploded view of FIG. 4, the antennas 204 and 208, and the shields 304 and 308, are shown displaced along an axis 400 that is substantially perpendicular to the interior surface 144 and the exterior surface 300. As seen in FIG. 4, a volume 404 projected from a portion of the interior surface 144 adjacent to the antenna 204 (when the device 100 is present) parallel to the axis 400 encompasses at least a portion of the shield 304. For example, the portion of the interior surface 144 used to define the volume 404 can correspond to a perimeter of the antenna 204 (simplified to a rectangle, in this illustration). In this example, at least one half of the surface area of the shield 304 lies within the volume 404, and in some examples a greater portion of the shield 304 lies within the volume 404. In other words, the shield 304 aligns with the position of the antenna 204 in a direction parallel to the axis 400. This alignment places the shield 304 substantially in between the antenna 204 and the operator or other object to which the mount 124 is coupled, and the portion of the radiation emitted by the antenna 204 that is reflected and/or absorbed by the shield 304 is directed towards the object. The shield 308 is also positioned in alignment (parallel to the axis 400) with the antenna 208. In other examples, a smaller portion of the shield 304 or 308 can intersect with a volume encompassing the corresponding antenna 204 or 208, e.g., to provide the cradle 136 with larger shields or the like.

FIG. 4 also illustrates a socket 408 on the exterior surface 300 of the cradle 136, e.g., to receive a ball joint affixed to the mount 124 and thereby couple the cradle 136 to the mount 124.

Figures 5A, 5B:
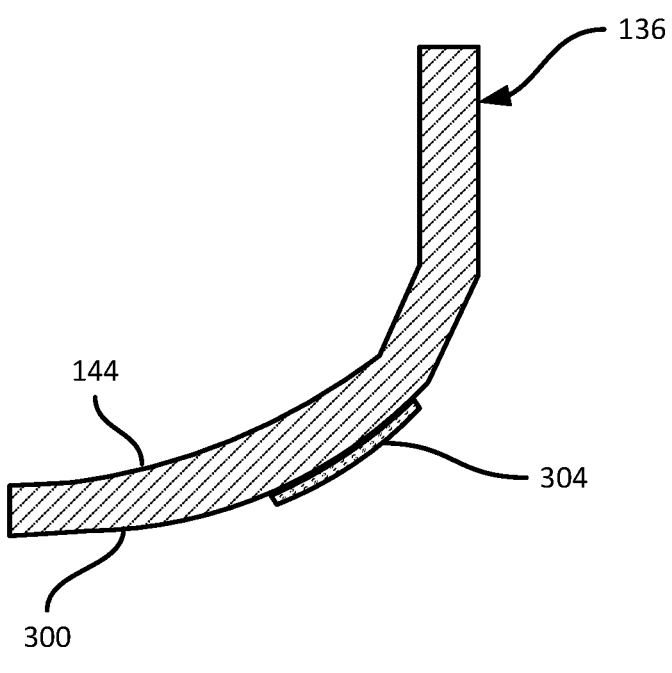
FIG. 5A is a diagram of a partial cross section of the cradle of FIG. 4.
FIG. 5B is a diagram of a partial cross section of the cradle of FIG. 4 according to another embodiment.

The shields 304 and 308 are shown in FIG. 3 and FIG. 4 as sheets of material, e.g., a conductive material distinct from the non-conductive material(s) forming the cradle 136. The shields 304 and 308 can be affixed to the exterior surface 300, for example by adhesives or the like. FIG. 5A illustrates a partial cross section of the cradle 136 illustrating the shield 304 affixed to the exterior surface 300. In other examples, the shield 304, and/or the shield 308 (or any other shield provided on the cradle 136, if more than two shields are provided) can be embedded within the cradle 136, as shown in FIG. 5B. In particular, FIG. 5B illustrates a partial cross section of a cradle 136' with a shield 304' embedded therein. The shield 304' can be, for example, a sheet of metal, a metallic mesh, a conductive fabric, or the like, embedded into the cradle 136 via overmolding or the like. When the accessory 120 includes more than one shield, the shields need not be affixed to the cradle 136 in the same manner as one another. For example, the shield 304 can be embedded within the cradle 136, and the shield 308 can be affixed to the exterior surface 300. In other examples, either or both of the shields 304, 308 can be disposed on the interior surface 144 rather than the exterior surface 300 or embedded within the cradle 136.

Figure 6:
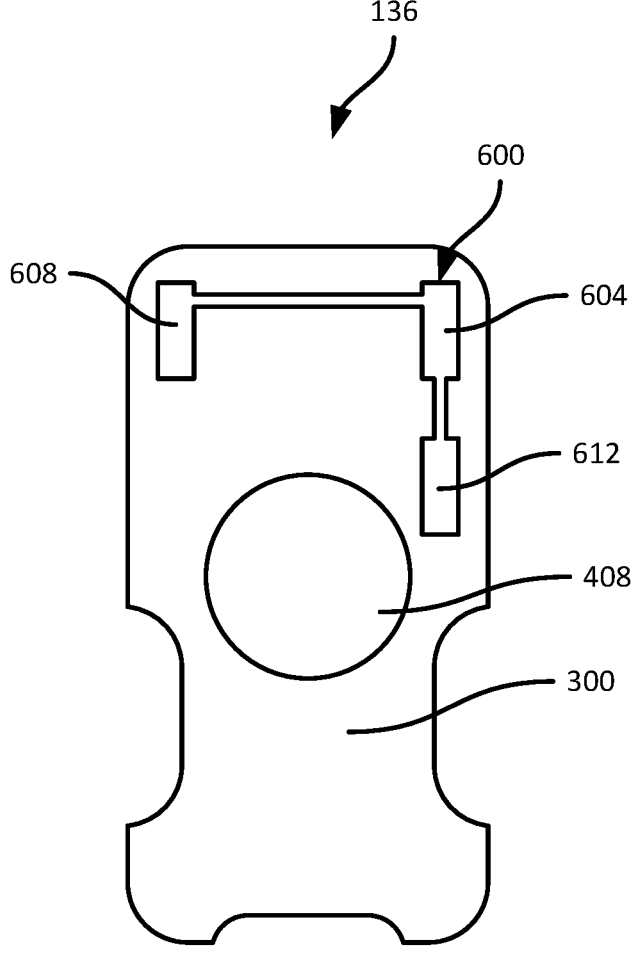
FIG. 6 is a diagram of a cradle of the accessory of FIG. 1, according to another embodiment.

In other embodiments, the accessory can be provided with shields for more than one antenna in the form of regions of a single shield component, e.g., for ease of placement during the manufacture of the accessory 120. For example, turning to FIG. 6, the cradle 136 is shown from below according to another embodiment. In the illustrated embodiment, a shield member 600 is affixed to or embedded within the cradle 136, including one or more regions corresponding to antennas of the device 100. For example, the shield member 600 can include a first region 604 corresponding to the antenna 204, and a second region 608 corresponding to the antenna 208. In this example, the shield member 600 also includes a third region 612, corresponding to a further antenna of the device 100. The regions 604, 608, 612 can be interconnected to form the member 600, e.g., forming a web of shield regions. The interconnections between regions can have smaller cross-sectional areas than the regions 604, 608, 612, e.g., to mitigate further antenna performance impacts.

Figure 7:
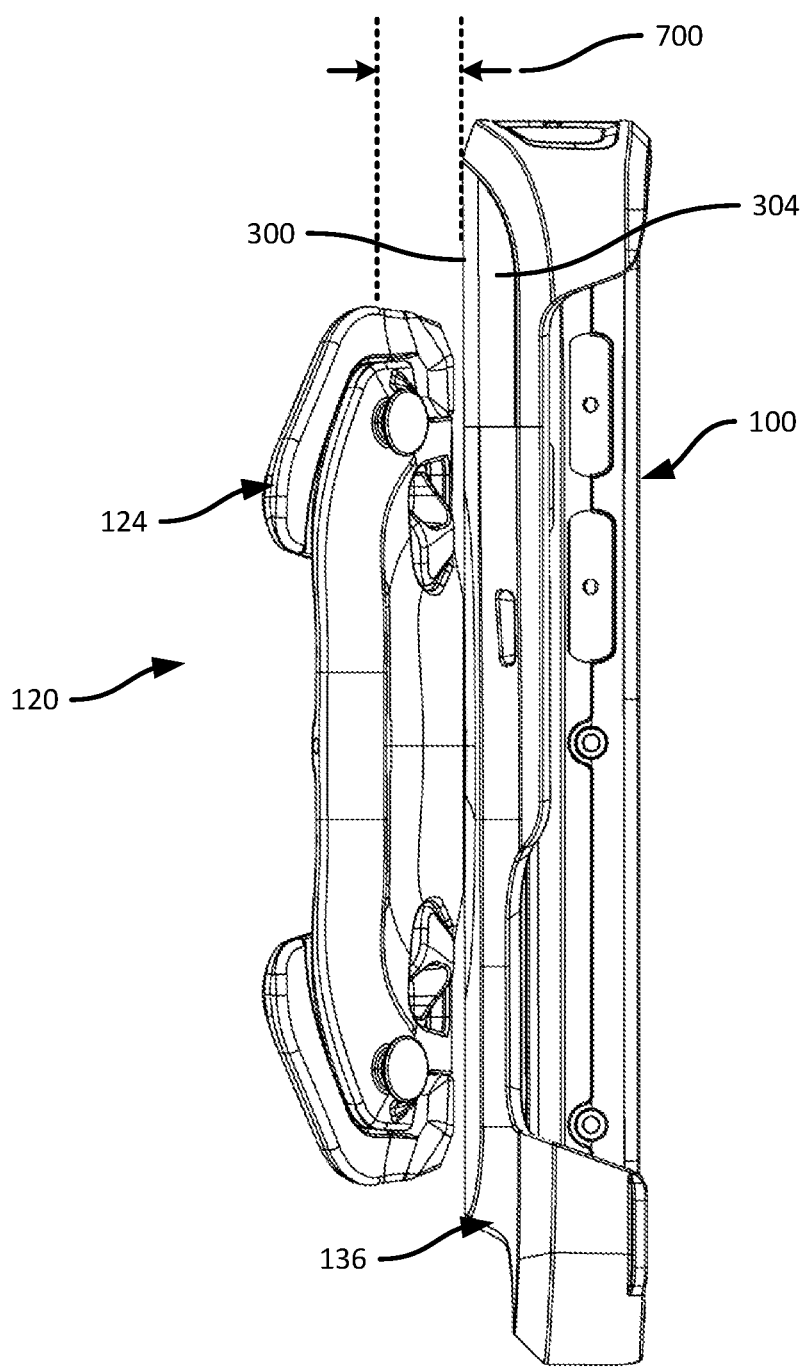
FIG. 7 is a diagram illustrating the cradle and the device of FIG. 1 from the side.

FIG. 7 illustrates a side view of the device 100 and the accessory 120, illustrating a height 700 between the mount 124 (specifically, the surface 128 of the mount 124, configured to engage with the operator or other object) and the exterior surface 300. The use of conductive shields on the accessory (e.g., on the cradle 136 as illustrated) may mitigate radiation emitted by the device 100 towards the mount 124 sufficiently to configure the accessory 120 with a height 700 of about 15 mm or less, while meeting SAR limits and substantially maintaining antenna performance at the device 100. For example, the shields 304 and 308 as described above may reduce an efficiency of the antennas 204, 208 of the device 100 by less than about –2 dB.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

Certain expressions may be employed herein to list combinations of elements. Examples of such expressions include: "at least one of A, B, and C"; "one or more of A, B, and C"; "at least one of A, B, or C"; "one or more of A, B, or C". Unless expressly indicated otherwise, the above expressions encompass any combination of A and/or B and/or C.

It will be appreciated that some embodiments may be comprised of one or more specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. An accessory for a computing device, the accessory comprising:
  a cradle defining a volume configured to receive the computing device, the cradle including:
  (i) an interior surface facing the volume and configured to engage with a housing of the computing device; and
  (ii) an exterior surface opposite the interior surface; and
  a conductive shield disposed between the volume and an object, the conductive shield configured to reduce radiation emitted by at least one antenna of the computing device towards the object, the conductive shield including a plurality of interconnected conductive regions, wherein interconnections between the plurality of conductive regions have a cross-sectional area smaller than a cross-sectional area of each of the plurality of conductive regions, the interconnections configured to reduce an impact of the conductive shield on antenna performance.

2. The accessory of claim 1, wherein the cradle is formed of a non-conductive first material, and wherein the conductive shield comprises a layer of a second material affixed to the cradle.

3. The accessory of claim 2, wherein the layer of the second material is affixed to the one of the exterior surface or the interior surface.

4. The accessory of claim 2, wherein the layer of the second material is embedded within the cradle, between the interior surface and the exterior surface.

5. The accessory of claim 2, wherein the layer of the second material is selected from the group consisting of: a metallic mesh, a fabric, and a metal sheet.

6. The accessory of claim 1, wherein at least a portion of the conductive shield is disposed within a volume projected from a portion of the interior surface adjacent to the antenna when the computing device is received in the cradle.

7. The accessory of claim 6, wherein the portion encompasses half of a surface area of the conductive shield.

8. The accessory of claim 1, wherein the conductive shield includes a first region configured to mitigate radiation emitted by an antenna of the computing device towards the object, and a second region configured to mitigate radiation emitted by another antenna of the computing device towards the object.

9. The accessory of claim 1, further comprising:
  a second conductive shield affixed to the cradle at a position distinct from a position of the conductive shield, the second conductive shield configured to mitigate radiation emitted by at least one other antenna of the computing device towards the object.

10. The accessory of claim 1, further comprising:
  a mount configured to engage with an object;
  wherein the exterior surface of the cradle is configured to connect to the mount.

11. The accessory of claim 10, wherein the mount includes a first surface configured to engage with the object; and
  wherein a distance between the interior surface of the cradle and the first surface of the mount is less than 15 mm.

12. The accessory of claim 10, wherein the conductive shield is disposed on the mount.

13. A wearable cradle for a computing device, the wearable cradle comprising:
  an exterior surface configured to couple the cradle to an object;
  an interior surface defining a volume configured to receive the computing device, a portion of the interior surface being configured to be disposed adjacent to at least one antenna of the computing device; and
  a conductive shield disposed adjacent to the portion of the interior surface, the conductive shield configured to reduce radiation emitted by the antenna towards the object, the conductive shield including a plurality of interconnected conductive regions, wherein interconnections between the plurality of conductive regions have a cross-sectional area smaller than a cross-sectional area of each of the plurality of conductive regions, the interconnections configured to reduce an impact of the conductive shield on antenna performance.

14. The wearable cradle of claim 13, wherein the cradle is formed of a non-conductive first material, and wherein the conductive shield comprises a layer of a second material affixed to the cradle.

15. The wearable cradle of claim 14, wherein the layer of the second material is affixed to one of the exterior surface and the interior surface.

16. The wearable cradle of claim 14, wherein the layer of the second material is embedded within the cradle, between the interior surface and the exterior surface.

17. The wearable cradle of claim 13, wherein the exterior surface is configured to engage with a mount to couple the cradle to the object.

\* \* \* \* \*